(12) United States Patent
Li et al.

(10) Patent No.: US 11,690,218 B2
(45) Date of Patent: Jun. 27, 2023

(54) ANTIFUSE OTP STRUCTURES WITH HYBRID LOW-VOLTAGE DEVICES

(71) Applicant: Zhuhai Chuangfeixin Technology Co., Ltd., Zhuhai (CN)

(72) Inventors: Li Li, Femont, CA (US); Zhigang Wang, Fremont, CA (US)

(73) Assignee: Zhuhai Chuangfeixin Technology Co., Ltd., Zhuhai (CN)

( * ) Notice: Subject to any disclaimer, the term of this patent is extended or adjusted under 35 U.S.C. 154(b) by 0 days.

(21) Appl. No.: 17/681,729

(22) Filed: Feb. 26, 2022

(65) Prior Publication Data

US 2022/0278114 A1  Sep. 1, 2022

Related U.S. Application Data

(63) Continuation of application No. 17/236,818, filed on Apr. 21, 2021, now Pat. No. 11,417,668, which is a continuation of application No. 16/816,537, filed on Mar. 12, 2020, now Pat. No. 11,018,143.

(51) Int. Cl.
| | |
|---|---|
| *H10B 20/20* | (2023.01) |
| *H01L 29/78* | (2006.01) |
| *H01L 29/66* | (2006.01) |
| *H01L 29/10* | (2006.01) |
| *H01L 21/266* | (2006.01) |

(Continued)

(52) U.S. Cl.
CPC .......... *H10B 20/20* (2023.02); *H01L 21/266* (2013.01); *H01L 21/26513* (2013.01); *H01L 21/324* (2013.01); *H01L 29/1083* (2013.01); *H01L 29/6659* (2013.01); *H01L 29/66537* (2013.01); *H01L 29/7833* (2013.01)

(58) Field of Classification Search
CPC . H10B 20/20; H01L 21/26513; H01L 21/266; H01L 21/324; H01L 29/1083; H01L 29/66537; H01L 29/6659; H01L 29/7833; H01L 23/5252; H01L 29/66659; H01L 29/7835
See application file for complete search history.

(56) References Cited

U.S. PATENT DOCUMENTS

| | | |
|---|---|---|
| 6,667,902 B2 | 12/2003 | Peng |
| 6,671,040 B2 | 12/2003 | Fong |
| 6,798,693 B2 | 9/2004 | Peng |

(Continued)

FOREIGN PATENT DOCUMENTS

| | | |
|---|---|---|
| CN | 104681558 A | 6/2015 |

*Primary Examiner* — David Vu
(74) *Attorney, Agent, or Firm* — Wolf, Greenfield & Sacks, P.C.

(57) ABSTRACT

An antifuse One-Time-Programmable memory cell includes a substrate, and a hybrid select transistor and a hybrid antifuse capacitor formed on the substrate. The hybrid select transistor includes a first gate dielectric layer formed on the substrate, wherein the first gate dielectric layer is thinner than 40 nm, a first high-voltage junction formed in the substrate, and a low-voltage junction formed in the substrate. The hybrid antifuse capacitor includes a second gate dielectric layer, wherein the second gate dielectric layer is thinner than 40 nm, which enables a low-voltage antifuse capacitor device, a second gate formed on the gate dielectric layer, a second high-voltage junction formed in the substrate, and a third high-voltage junction formed in the substrate.

15 Claims, 12 Drawing Sheets

(51) Int. Cl.
*H01L 21/324* (2006.01)
*H01L 21/265* (2006.01)

(56) References Cited

U.S. PATENT DOCUMENTS

| | | |
|---|---|---|
| 6,822,888 B2 | 11/2004 | Peng |
| 7,402,855 B2 | 7/2008 | Kurjanowiez |
| 8,283,751 B2 | 10/2012 | Kurjanowicz |
| 10,777,288 B2 * | 9/2020 | Kurjanowicz ......... G11C 17/10 |

* cited by examiner

ANTIFUSE OTP STRUCTURES WITH HYBRID LOW-VOLTAGE DEVICES

BACKGROUND OF THE INVENTION

The present invention relates to the technical field of semiconductor memory, and in particular, to One Time Programmable (OTP) memory.

Embedded Non-Volatile Memory (ENVM) technology has been employed in a number of applications such as post silicon tuning, memory repair, on-line field test, and secure ID storage. ENVM is also a critical component for self-healing applications in which information regarding time dependent failure mechanisms such as circuit aging must be retained during system power off periods. Anti-Fuse One Time Programmable (AF-OTP) NVM memory has been extensively used for memory repair in standard logic processes.

An antifuse is non-conductive in the native unprogrammed state and becomes conductive when programmed, hence the name antifuse. In integrated circuit, antifuse is commonly constructed with a thin dielectric layer sandwiched between two conductors. To program an antifuse, a high voltage is applied between the two conductors. This leads to a physical and permanent breakdown of the thin dielectric layer and the formation of a current conduction path between the two conductors. Antifuse can thus be used as a memory element. Programmed state of an antifuse represents data "1" and unprogrammed state "0" or vice versa. Once programmed, antifuse memory cannot revert to unprogrammed state, i.e., it is a one-time programmable memory. Antifuse retains conductive or non-conductive state even after the power is turned off, rendering the data non-volatile. As such, antifuse memory is a non-volatile OTP memory.

In order to provide a high voltage to program the antifuse capacitor, the select transistor is usually built with thick gate dielectric layer in the device, and with high voltage junctions. However, high-voltage transistor devices with high voltage junctions will take more silicon area because wider channel length and width are needed, and the more silicon area will directly correlate to higher cost and lower integration density. On the other hand, the antifuse capacitor is usually built with a thinner gate dielectric layer for easier programming, and low-voltage junctions are usually applied in conjunction with its low-voltage device.

There is therefore a need for antifuse OTP memory cells with high structural simplicity, and high integration density.

SUMMARY OF THE INVENTION

In view of the above, the present disclosure provides an antifuse OTP memory bit cell that includes an antifuse capacitor and a metal-oxide-semiconductor field-effect-transistor (MOSFET). The MOSFET is a select transistor which is implemented to program or access the antifuse capacitor. A novel memory cell includes a hybrid structure: a low voltage gate dielectric layer, and a high voltage junction or a mixed high-voltage and low-voltage junctions, for smaller silicon footprint. A novel select transistor includes a low-voltage gate dielectric layer, and a low-voltage junction or a mixed high-voltage and low-voltage junctions, or high-voltage junctions, for both high voltage programming and smaller silicon area.

In one general aspect, the present invention relates to an antifuse One-Time-Programmable memory cell, which includes a substrate; a hybrid select transistor formed on the substrate that includes: a first gate dielectric layer formed on the substrate, wherein the first gate dielectric layer is thinner than 40 nm, which enables a low-voltage select transistor device; a first gate formed on the gate dielectric layer; a first high-voltage junction formed in the substrate; and a low-voltage junction formed in the substrate, wherein a source and a drain for the select transistor are formed by the first high-voltage junction and the low-voltage junction; and a hybrid antifuse capacitor formed on the substrate that includes a second gate dielectric layer formed on the substrate, wherein the second gate dielectric layer is thinner than 40 nm, which enables a low-voltage antifuse capacitor device; a second gate formed on the gate dielectric layer; a second high-voltage junction formed in the substrate; and a third high-voltage junction formed in the substrate, wherein a source and a drain for the antifuse capacitor are respectively formed by the second high-voltage junction and the third high-voltage junction.

Implementations of the system may include one or more of the following. The second high-voltage junction and the third high-voltage junction of the antifuse capacitor can be separated by a channel in the substrate. The second high-voltage junction and the third high-voltage junction of the antifuse capacitor can be electrically connected. The first gate dielectric layer or the second gate dielectric layer can be thinner than 30 nm. The hybrid select transistor can be a low voltage device operating at 3.3V or below. The hybrid antifuse capacitor can be a low voltage device operating at 3.3V or below. The first high-voltage junction or the second high-voltage junction or the third high-voltage junction can have a threshold junction breakdown voltage above 3.3 Volt. The first high-voltage junction or the second high-voltage junction or the third high-voltage junction can have a threshold junction breakdown voltage above 5 Volt. The second high-voltage junction and the third high-voltage junction can be electrically connected. The low-voltage junction can include a first doped region adjacent to the first gate dielectric layer at a lower doped level than a second doped region away from the first gate dielectric layer. The first high-voltage junction can include a first doped region adjacent to the first gate dielectric layer at a lower doped level than a second doped region away from the first gate dielectric layer. The first high-voltage junction can also have a substantially uniform doping level. The second high-voltage junction or the third high-voltage junction can include a first doped region adjacent to the second gate dielectric layer at a lower doped level than a second doped region away from the second gate dielectric layer. The second high-voltage junction or the third high-voltage junction can have a substantially uniform doping level.

In another general aspect, the present invention relates to an antifuse One-Time-Programmable memory cell, which includes: a substrate; a low-voltage select transistor formed on the substrate which includes: a first gate dielectric layer formed on the substrate, wherein the first gate dielectric layer is thinner than 40 nm, which enables a low-voltage select transistor device; a first gate formed on the gate dielectric layer; a first low-voltage junction formed in the substrate; and a second low-voltage junction formed in the substrate, wherein a source and a drain for the select transistor are formed by the first low-voltage junction and the second low-voltage junction; and a hybrid antifuse capacitor formed on the substrate, which includes: a second gate dielectric layer formed on the substrate, wherein the second gate dielectric layer is thinner than 40 nm, which enables a low-voltage antifuse capacitor device; a second gate formed on the gate dielectric layer; a first high-voltage junction formed in the substrate; and a second high-voltage junction formed in the substrate, wherein a source and a drain for the antifuse capacitor are respectively formed by the first high-voltage junction and the second high-voltage junction.

Implementations of the system may include one or more of the following. The first high-voltage junction and the second high-voltage junction of the antifuse capacitor can be separated by a channel in the substrate. The first high-voltage junction and the second high-voltage junction of the antifuse capacitor are electrically connected. The first gate dielectric layer or the second gate dielectric layer can be thinner than 30 nm. The hybrid select transistor can be a low voltage device operating at 3.3V or below. The hybrid antifuse capacitor can be a low voltage device operating at 3.3V or below. The first high-voltage junction or the second high-voltage junction can have a threshold junction breakdown voltage above 3.3 Volt. The second low-voltage junction and the first high-voltage junction can be electrically connected. The first low-voltage junction or the second low-voltage junction can include a first doped region adjacent to the first gate dielectric layer at a lower doped level than a second doped region away from the first gate dielectric layer. The first high-voltage junction or the second high-voltage junction can include a first doped region adjacent to the second gate dielectric layer at a lower doped level than a second doped region away from the second gate dielectric layer.

BRIEF DESCRIPTION OF THE DRAWINGS

To illustrate the technical solutions of the present invention, the accompanying drawings briefly described embodiments need to be used in describing the embodiments. Obviously, the following drawings only describe examples of the present invention. For those skilled in the art, other drawings may also be obtained according to these drawings without any creative work.

DETAILED DESCRIPTION OF THE INVENTION

The technical solutions in the embodiments of the present invention are described with reference to the accompanying drawings in the embodiments of the present invention.

Figure 1A:
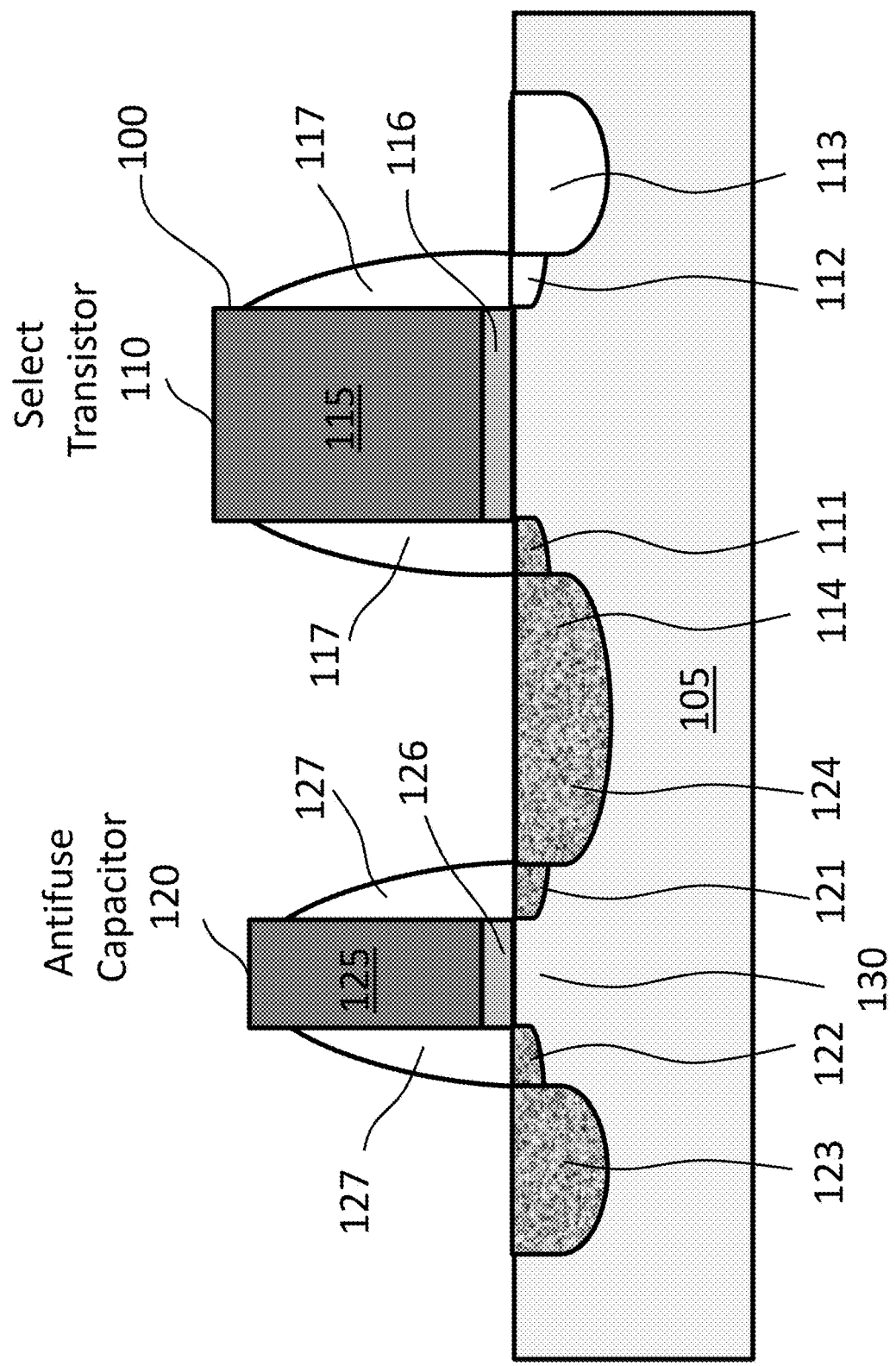
FIG. 1A is a cross-sectional view of an antifuse OTP memory cell having a hybrid low-voltage antifuse capacitor and a hybrid low-voltage select transistor in accordance with some embodiments of the present invention.
Figure 1B:
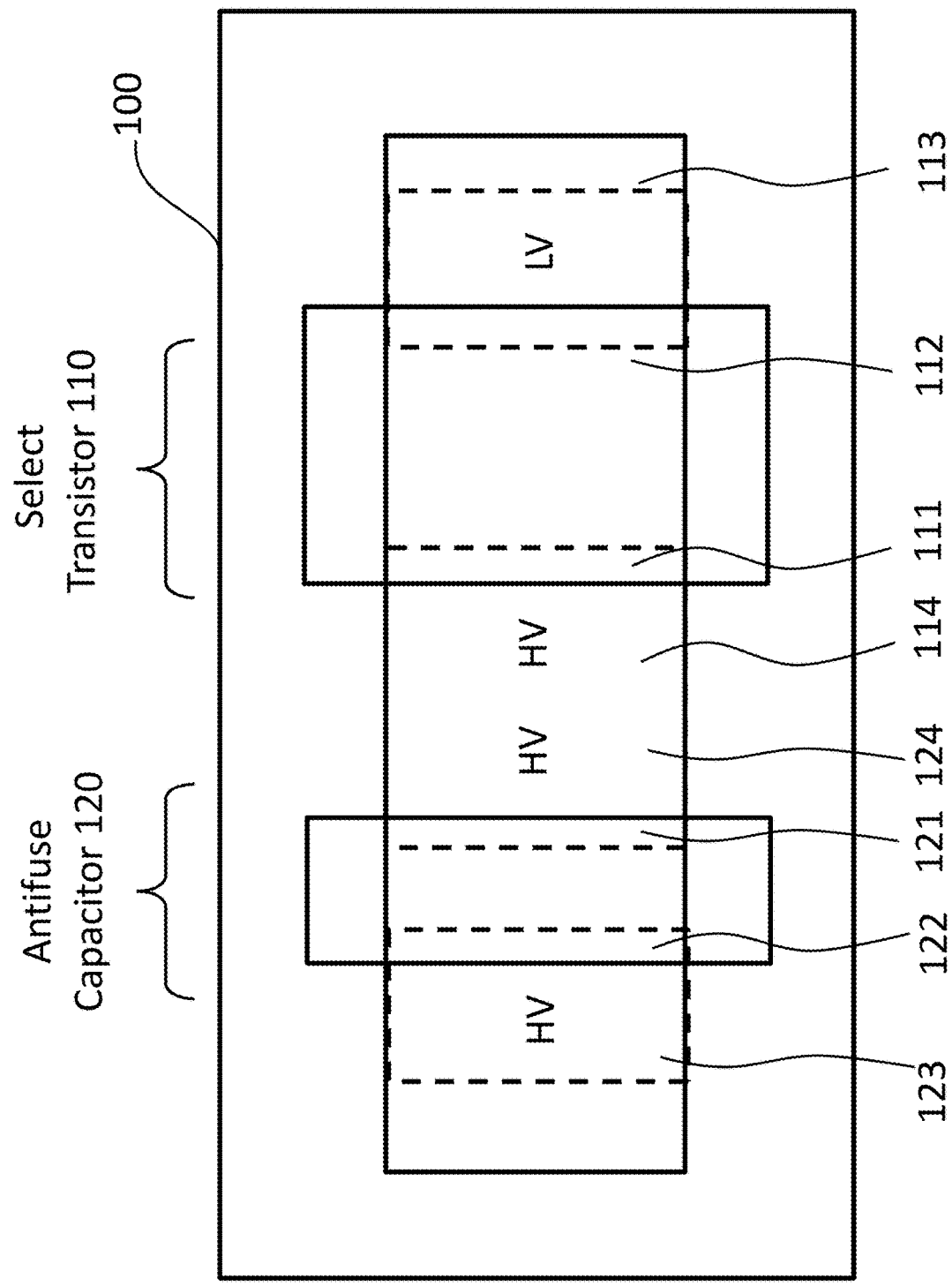
FIG. 1B is a schematic planar drawing of the antifuse OTP memory cell shown in FIG. 1A.

In some embodiments, the antifuse OTP memory uses metal-oxide-semiconductor (MOS) capacitor as the antifuse element. The MOS capacitor is connected to an access device called select transistor, typically a metal-oxide-semiconductor field-effect-transistor (MOSFET) to form an antifuse memory bit cell. Referring to FIGS. 1A-1B, an antifuse OTP memory cell 100 includes a select transistor 110 and an antifuse capacitor 120. The select transistor 110 includes a gate 115 on a gate dielectric 116 on a substrate 105. The gate dielectric 116 includes a thin dielectric layer, which makes the select transistor 110 a low-voltage device. For silicon oxide, a thin dielectric layer is typically below 40 angstroms, and can further be thinner than 30 angstroms. The antifuse capacitor 120 includes a gate 125 on a gate dielectric 126 on the substrate 105. The gate dielectric 126 includes a thin dielectric layer. A thin dielectric layer is typically below 40 angstroms for silicon oxide, and can further be thinner than 30 angstroms, which makes the antifuse capacitor 120 also a low-voltage device. A low voltage device can operate at 3.3V or below, or further at 2.5V or below.

The junctions (e.g., the source or the drain) of the select transistor 110 are formed respectively by lightly doped regions 111, 112 and the deeply doped regions 113, 114. The two junctions are separated in the substrate 105.

The junctions (e.g., source or drain) of the antifuse capacitor 120 are formed respectively by lightly doped regions 121, 122 and the deeply doped regions 123, 124. The junctions (respectively formed by the doped regions 122, 123 and the doped regions 121, 124) of the antifuse capacitor 120 are separated by a channel 130 and not connected in the substrate 105 (in contrast to the example described in FIG. 2 below).

The combination of lightly doped regions 111, 112 and 121, 122 and deeply doped regions 113, 114 and 123, 124 is formed on both sides of the channels by applying the spacer structures 117, 127 between two doping processes.

The source/drain and the gates 115, 125 of the select transistor 110 and the antifuse capacitor 120 are of the same conductivity type. The transistor channel region, i.e., the silicon substrate 105 underneath gate dielectric is of the opposite conductivity type. In the select transistor 110, for example, if the gate 115 and source/drain respectively formed by doped regions 111, 114 and doped regions 112, 113 are N type, the regions of the substrate 105 underneath the gate dielectric 116 is P type. Thus, the source/drain regions form PN junctions with the oppositely doped silicon substrate 105. Similarly, for the antifuse capacitor 120, if the gate 125 and source/drain respectively formed by doped regions 121, 124 and 122, 123 are N type, the region of the substrate 105 underneath the gate dielectric 126 is P type.

The doped regions 111, 112 and 121, 122 are lightly doped, wherein the electrically active concentration of dopant level can be in a range of $1\times10^{17}\sim1\times10^{19}$ atoms/cm$^3$. The doped regions 113, 114 and 123, 124 formed on both sides of the channels are deeply doped, wherein the electrically active concentration of dopant level can be above $2\times10^{19}$ atoms/cm$^{-3}$.

Doped regions of 113, 112 are connected, and they are electrically conductive. Similarly, doped regions 111, 114, 124, and 121 are connected, and they are electrically conductive. Doped regions 122, 123 are also connected. During antifuse programming, a voltage is applied on the gate 115 to turn on the select transistor 110, i.e., to form a conductive channel in the substrate 105 underneath the gate dielectric 116. In the meantime, a programming voltage is applied to the doped region 113. Through the conductive path underneath the gate dielectric 116, the programming voltage is actually applied on the gate dielectric 126 to cause a dielectric breakdown. A low electrical resistance will be measured between the gate 125 and the doping region 124 or the doping region 123.

In order for transistor to function normally, the junction bias needs to be below junction breakdown voltage. For low voltage transistor, a shallower and steeper junction can be used without causing breakdown. Thus, the device can have better short-channel behaviors. Formation of this kind of junction requires shallower implants, lower temperature and shorter anneals. For high-voltage transistor, it is critical to avoid a peak junction electric field that may cause breakdown; therefore, the junction profile must be adjusted accordingly. To avoid introducing a very high peak field at the junction, more gradual junction doping profiles are preferred. This usually means deeper implants, longer (maybe multiple) annealing steps. This kind of junctions consequently can handle higher bias voltages.

The gate 115 and the gate dielectric 116 in the select transistor 110 support a low-voltage device for high programming yield. The doped regions 111/114 form a high-voltage (HV) junction, while doped regions 112/113 form a low-voltage (LV) junction with the substrate 105 for the select transistor 110. The breakdown threshold voltage for HV junctions can be higher than 3.3V, or higher than 5V depending on technology node of the device. The breakdown threshold voltage for LV junctions can be lower than 3.2V, or below 2.3V depending on technology node of the device.

An important aspect of the antifuse OTP memory cell 100 is that both the gate 125 and the gate dielectric 126 in the antifuse capacitor 120 and the gate 115 and the gate dielectric 116 in the select transistor 110 support low-voltage devices, which reduce silicon footprint. Moreover, the select transistor 110 includes a low-voltage (LV) junction formed by doped regions 112/113, which also reduces silicon footprint. The other high-voltage junction formed by doped regions 111/114 enables the select transistor 110 to have an improved programming yield.

In the antifuse capacitor 120, the doped regions 122/123 and 121/124 form HV junctions with the substrate 105. The junction breakdown threshold voltage for HV junctions can be higher than 3.3V, or higher than 5V depending on technology node of the device. The combination of low voltage gate dielectric layer (i.e., an LV device) and a high voltage junction provides low silicon footprint and high programming yield.

Since HV junctions are formed for both the antifuse capacitor 120 and the select transistor 110, the deeply doped regions 114 and 124 can be combined to simplify the structure and process. Thus, the HV junction formed by doped regions 111, 114 for the select transistor 110 and the HV junction formed by doped regions 121, 124 for the antifuse capacitor 120 are conductively connected.

Figure 2:
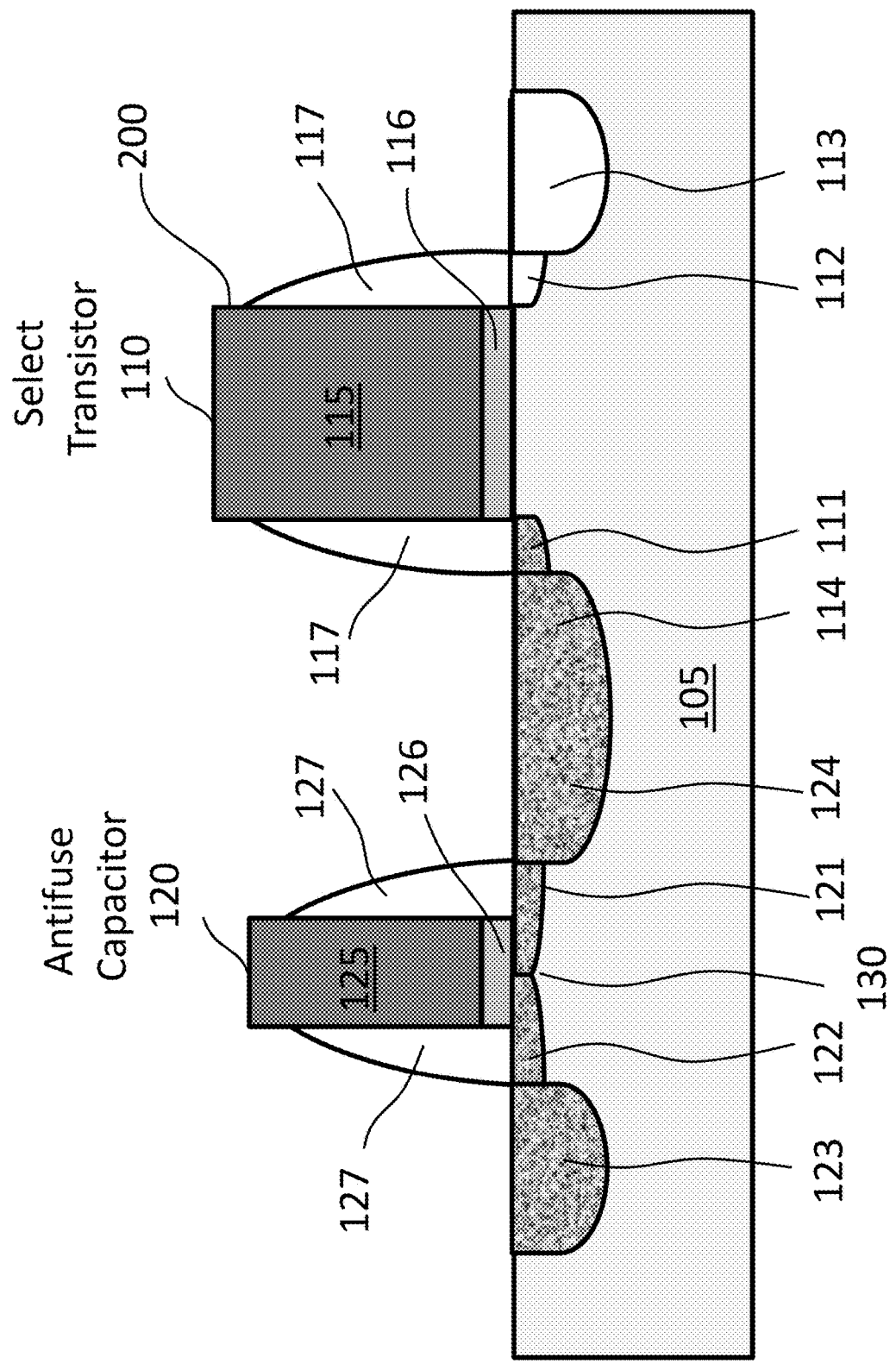
FIG. 2 is a cross-sectional view of the antifuse OTP memory cell related to the antifuse OTP memory cell in FIG. 1A.

In some embodiments, referring to FIG. 2, an antifuse OTP memory cell 200 includes a select transistor 110 and an antifuse capacitor 120 and associated components, similar to the antifuse OTP memory cell 100 as described above. A difference from the antifuse OTP memory cell 100 is that the lightly doped regions 121, 122 in the antifuse OTP memory cell 200 are electrically connected instead of separated by a channel.

An antifuse is non-conductive in the native unprogrammed state and becomes conductive when programmed. Usually, a voltage is applied on the antifuse capacitor, e.g., between the deeply doped regions 123 and gate 125. An electric current is measured to determine if the antifuse memory cell is programmed or not. However, if the lightly doped regions 121 and 122 are not connected in the substrate 105 underneath the gate oxide 126 (i.e., separated by the channel 130 in FIG. 1A), part of the electric current will leak into the substrate 105 through the channel 130 shown in FIG. 1A and the current may not be stable. By merging the dopant area 121 and 122, the current leakage path into the substrate 105 is blocked, and current measurement noise can be effectively reduced.

Figure 3:
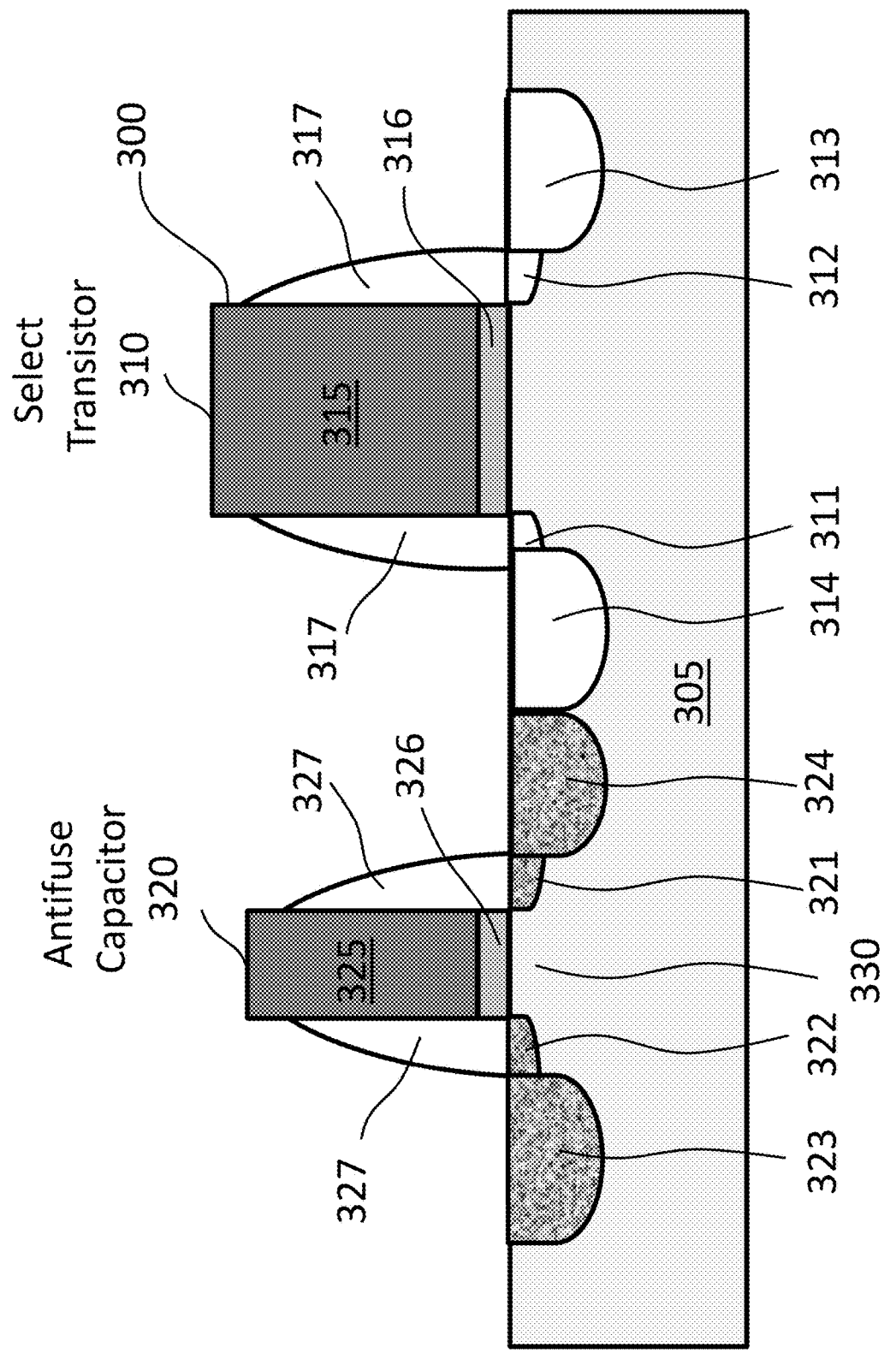
FIG. 3 is a cross-sectional view of another antifuse OTP memory cell having a hybrid low-voltage antifuse capacitor and a low-voltage select transistor in accordance with some embodiments of the present invention.

In some embodiments, referring to FIG. 3, an antifuse OTP memory cell 300 includes a select transistor 310 and an antifuse capacitor 320. The select transistor 310 includes a gate 315 on a gate dielectric 316 on a substrate 305. The gate dielectric 316 includes a thin dielectric layer, which makes the select transistor 310 a low-voltage device. For silicon oxide, a thin dielectric layer can be 40 angstroms or thinner, or further, can be thinner than 30 angstroms. The antifuse capacitor 320 includes a gate 325 on a gate dielectric 326 on the substrate 305. The gate dielectric 326 includes a thin dielectric layer, which makes the antifuse capacitor 320 also a low-voltage device.

The junctions (e.g., the source or the drain) of the select transistor 310 are formed respectively by lightly doped regions 311, 312 and the deeply doped regions 313, 314. The two junctions are separated in the substrate 305.

The junctions (e.g., source or drain) of the antifuse capacitor 320 are formed respectively by lightly doped regions 321, 322 and the deeply doped regions 323, 324. The junctions (respectively formed by the doped regions 322, 323 and the doped regions 321, 324) of the antifuse capacitor 320 are separated by a channel 330 and not connected in the substrate 305 (in contrast to the example described in FIG. 4 below).

The combination of lightly doped regions 311, 312 and 321, 322 and deeply doped regions 313, 314 and 323, 324 is formed on both sides of the channels by applying the spacer structures 317, 327 between two doping processes.

The source/drain and the gates 315, 325 of the select transistor 310 and the antifuse capacitor 320 are of the same conductivity type. The transistor channel region, i.e., the silicon substrate 305 underneath gate dielectric is of the opposite conductivity type. In the select transistor 310, for example, if the gate 315 and source/drain respectively formed by doped regions 311, 314 and doped regions 312, 313 are N type, the regions of the substrate 305 underneath the gate dielectric 316 is P type. Thus, the source/drain regions form PN junctions with the oppositely doped silicon substrate 305. Similarly, for the antifuse capacitor 320, if the gate 325 and source/drain respectively formed by doped regions 321, 324 and 322, 323 are N type, the region of the substrate 305 underneath the gate dielectric 326 is P type.

The doped regions 311, 312 and 321, 322 are lightly doped, wherein the electrically active concentration of dopant level can be in a range of $1 \times 10^{17} \sim 1 \times 10^{19}$ atoms/cm$^3$. The doped regions 313, 314 and 323, 324 formed on both sides of the channels are deeply doped, wherein the electrically active concentration of dopant level can be above $2 \times 10^{19}$ atoms/cm$^{-3}$.

Doped regions of 313, 312 are connected, and they are electrically conductive. Similarly, doped regions 311, 314, 324, and 321 are connected, and they are electrically conductive. Doped regions 322, 323 are also connected. During antifuse programming, a voltage is applied on the gate 315 to turn on the select transistor 310, i.e., to form a conductive channel in the substrate 305 underneath the gate dielectric 316. In the meantime, a programming voltage is applied to the doped region 313. Through the conductive path underneath the gate dielectric 316, the programming voltage is actually applied on the gate dielectric 326 to cause a dielectric breakdown. A low electrical resistance will be measured between the gate 325 and the doping region 324 or between the gate 325 and the doping region 323.

The gate 315 and the gate dielectric 316 in the select transistor 310 support a low-voltage device for area scaling. The doped regions 311/314 and doped regions 312/313 form a low-voltage (LV) junction with the substrate 305 for the select transistor 310. The breakdown threshold voltage for HV junctions can be higher than 3.3V, or higher than 5V depending on technology node of the device. The breakdown threshold voltage for LV junctions can be lower than 3.2V, or below 2.3V depending on technology node of the device.

An important aspect of the antifuse OTP memory cell 300 is that both the gate 325 and the gate dielectric 326 in the antifuse capacitor 320 and the gate 315 and the gate dielectric 316 in the select transistor 310 support low-voltage devices, which reduce silicon footprint. Moreover, the select transistor 310 includes low-voltage (LV) junctions formed by doped regions 312/313 and 311/314, which also reduces silicon footprint.

Figure 4:
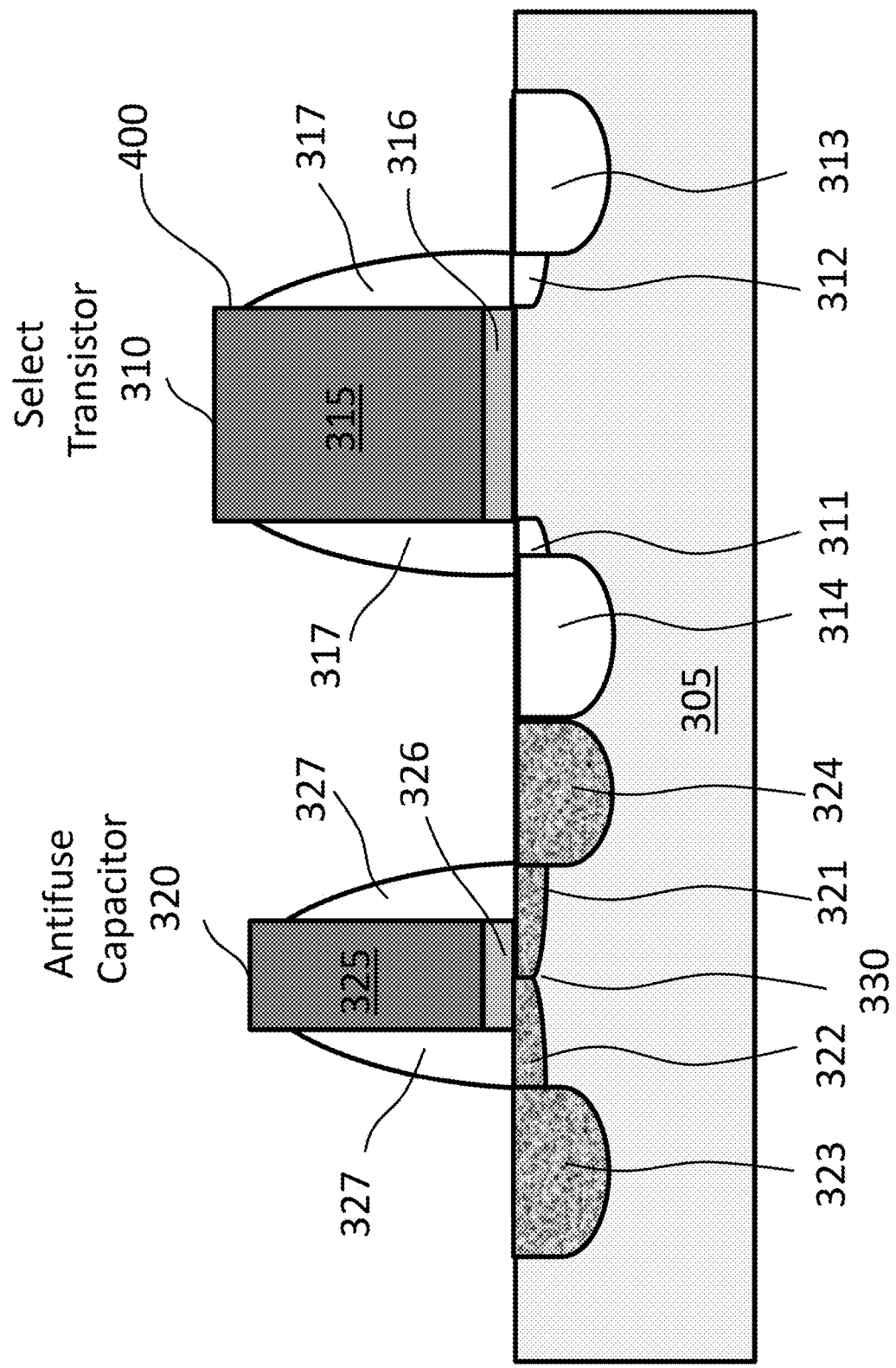
FIG. 4 is a cross-sectional view of the antifuse OTP memory cell related to the antifuse OTP memory cell in FIG. 3.

In some embodiments, referring to FIG. 4, an antifuse OTP memory cell 400 includes a select transistor 310 and an antifuse capacitor 320 and associated components, similar to the antifuse OTP memory cell 300 as described above in relation to FIG. 3. A difference from the antifuse OTP memory cell 300 is that the lightly doped regions 321, 322 in the antifuse OTP memory cell 400 are electrically connected instead of separated by a channel.

An antifuse is non-conductive in the native unprogrammed state and becomes conductive when programmed. Usually, a voltage is applied on the antifuse capacitor, e.g., between the deeply doped region 323 and gate 325 or between the deeply doped region 324 and gate 325. An electric current is measured to determine if the antifuse memory cell is programmed or not. However, if the lightly doped regions 321 and 322 are not connected in the substrate 305 underneath the gate oxide 326 (i.e., separated by the channel 330 shown in FIG. 3), part of the electric current will leak into the substrate 305 through the channel 330 (FIG. 3); the current measurement will not be stable. By merging the dopant area 321 and 322, the current leakage path into the substrate 305 is blocked, and current measurement noise can be effectively reduced.

Figure 5:
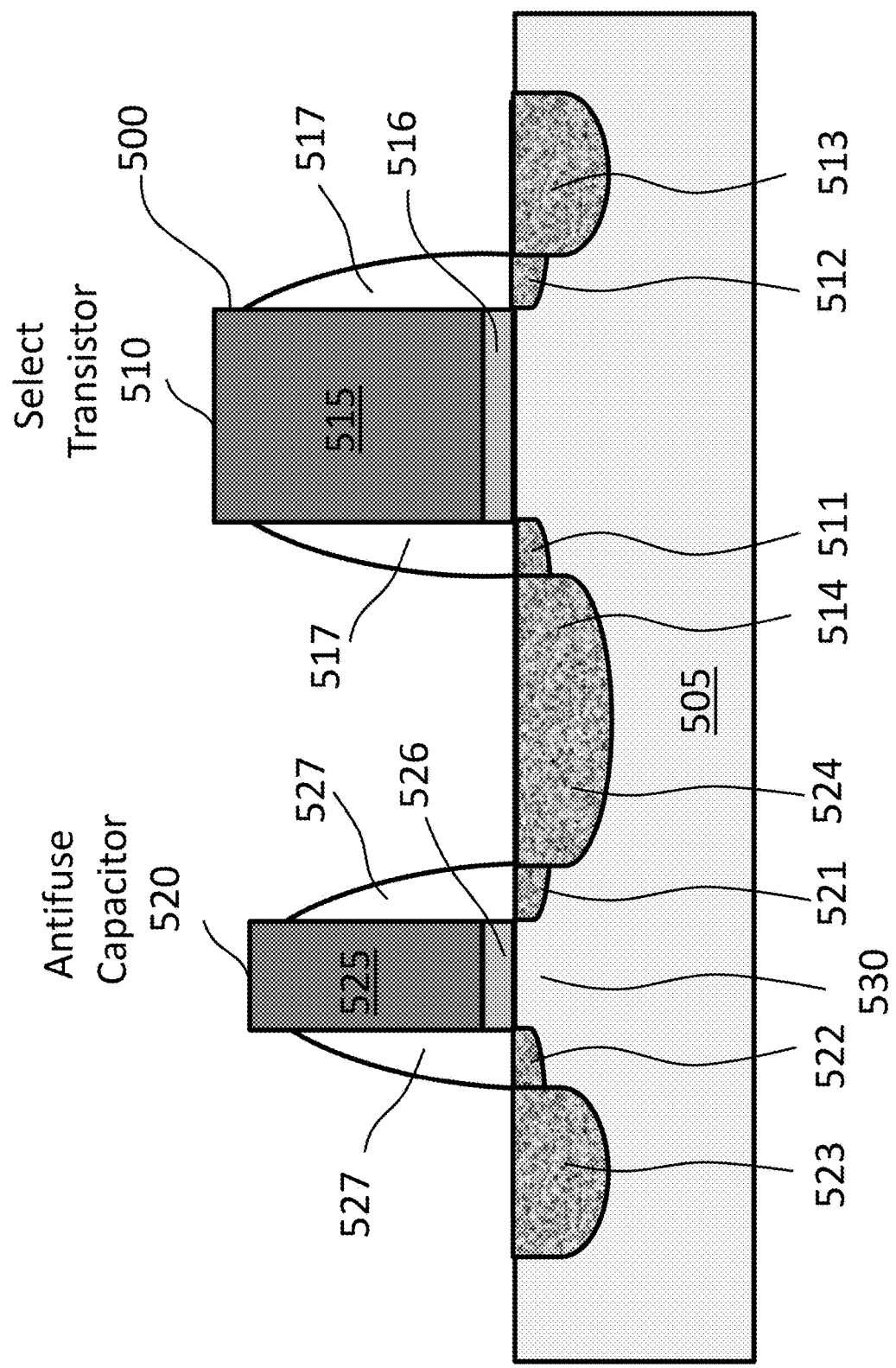
FIG. 5 is a cross-sectional view of another antifuse OTP memory cell having a hybrid low-voltage antifuse capacitor and a hybrid low-voltage select transistor in accordance with some embodiments of the present invention.

In some embodiments, referring to FIG. 5, an antifuse OTP memory cell 500 includes a select transistor 510 and an antifuse capacitor 520. The select transistor 510 includes a gate 515 on a gate dielectric 516 on a substrate 505. The gate dielectric 516 includes a thin dielectric layer, which makes the select transistor 510 a low-voltage device. For silicon oxide, a thin dielectric layer can be 40 angstroms or thinner, or further, can be thinner than 30 angstroms. The antifuse capacitor 520 includes a gate 525 on a gate dielectric 526 on the substrate 505. The gate dielectric 526 includes a thin dielectric layer, which makes the antifuse capacitor 520 also a low-voltage device.

The junctions (e.g., the source or the drain) of the select transistor 510 are formed respectively by lightly doped regions 511, 512 and the deeply doped regions 513, 514. The two junctions are separated in the substrate 505.

The junctions (e.g., source or drain) of the antifuse capacitor 520 are formed respectively by lightly doped regions 521, 522 and the deeply doped regions 523, 524. The junctions (respectively formed by the doped regions 522, 523 and the doped regions 521, 524) of the antifuse capacitor 520 are separated by a channel 530 and not connected in the substrate 505 (in contrast to the example described in FIG. 6 below).

The combination of lightly doped regions 511, 512 and 521, 522 and deeply doped regions 513, 514 and 523, 524 is formed on both sides of the channels by applying the spacer structures 517, 527 between two doping processes.

The source/drain and the gates 515, 525 of the select transistor 510 and the antifuse capacitor 520 are of the same conductivity type. The transistor channel region, i.e., the silicon substrate 505 underneath gate dielectric is of the opposite conductivity type. In the select transistor 510, for example, if the gate 515 and source/drain respectively formed by doped regions 511, 514 and doped regions 512, 513 are N type, the regions of the substrate 505 underneath the gate dielectric 516 is P type. Thus, the source/drain regions form PN junctions with the oppositely doped silicon substrate 505. Similarly, for the antifuse capacitor 520, if the gate 525 and source/drain respectively formed by doped regions 521, 524 and 522, 523 are N type, the region of the substrate 505 underneath the gate dielectric 526 is P type.

The doped regions 511, 512 and 521, 522 are lightly doped, wherein the electrically active concentration of dopant level can be in a range of $1 \times 10^{17} \sim 1 \times 10^{19}$ atoms/cm$^3$. The doped regions 513, 514 and 523, 524 formed on both sides of the channels are deeply doped, wherein the electrically active concentration of dopant level can be above $2 \times 10^{19}$ atoms/cm$^{-3}$.

Doped regions of 513, 512 are connected, and they are electrically conductive. Similarly, doped regions 511, 514, 524, and 521 are connected, and they are electrically conductive. Doped regions 522, 523 are also connected. During antifuse programming, a voltage is applied on the gate 515 to turn on the select transistor 510, i.e., to form a conductive channel in the substrate 505 underneath the gate dielectric 516. In the meantime, a programming voltage is applied to the doped region 513. Through the conductive path underneath the gate dielectric 516, the programming voltage is actually applied on the gate dielectric 526 to cause a dielectric breakdown. A low electrical resistance will be measured between the gate 525 and the doping region 524 or between the gate 525 and the doping region 523.

The gate 515 and the gate dielectric 516 in the select transistor 510 support a low-voltage device for high programming yield. The doped regions 511/514 and the doped regions 512/513 form high-voltage (HV) junctions with the substrate 505 for the select transistor 510. The breakdown threshold voltage for HV junctions can be higher than 3.3V, or higher than 5V depending on technology node of the device. The breakdown threshold voltage for LV junctions can be lower than 3.2V, or below 2.3V depending on technology node of the device.

An important aspect of the antifuse OTP memory cell 500 is that both the gate 525 and the gate dielectric 526 in the antifuse capacitor 520 and the gate 515 and the gate dielectric 516 in the select transistor 510 support low-voltage devices, which reduce silicon footprint. Moreover, the high-voltage junctions in the select transistor 510 can provide increased programming yield.

Figure 6:
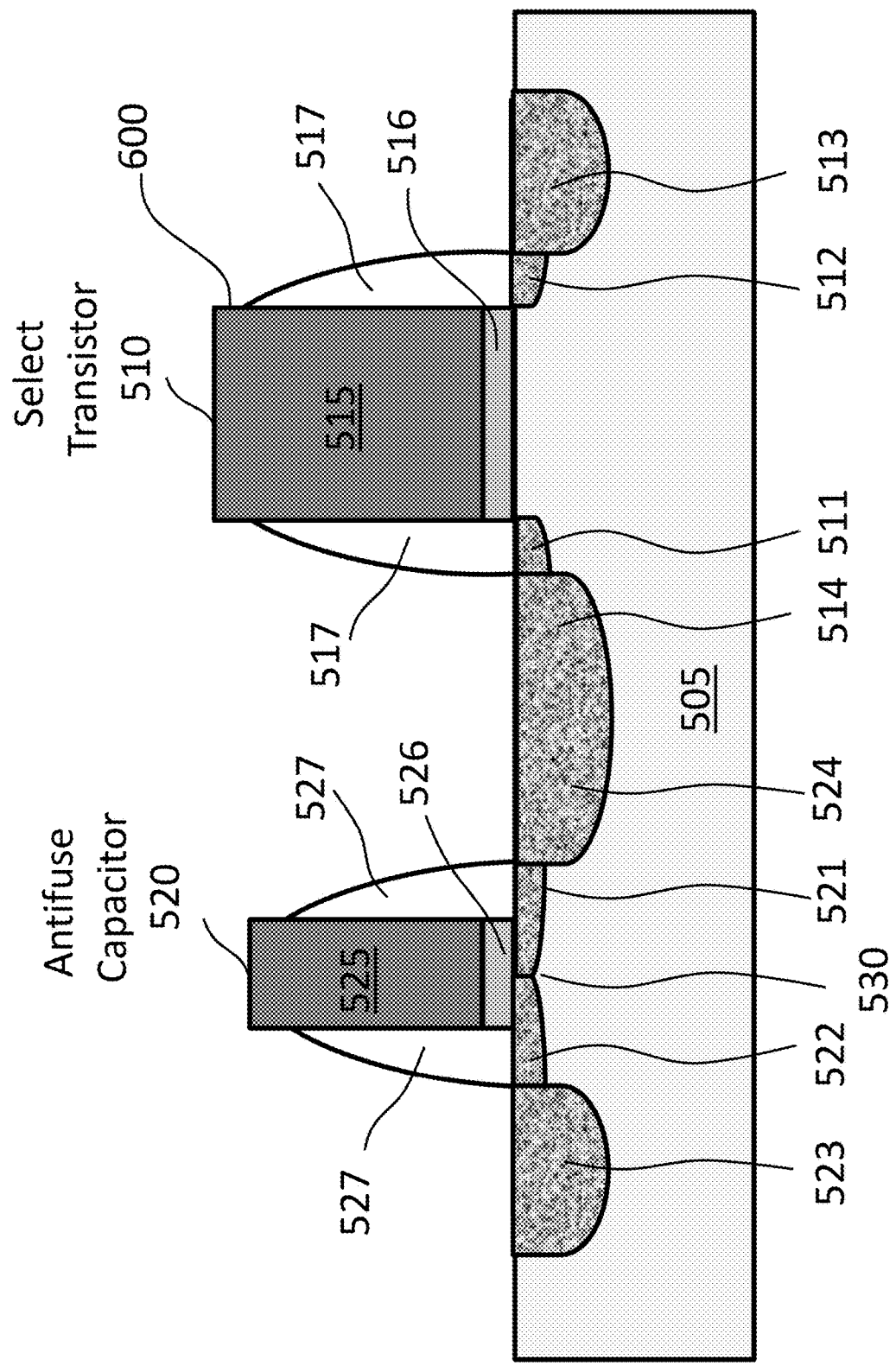
FIG. 6 is a cross-sectional view of the antifuse OTP memory cell related to the antifuse OTP memory cell in FIG. 5.

In some embodiments, referring to FIG. 6, an antifuse OTP memory cell 600 includes a select transistor 510 and an antifuse capacitor 520 and associated components, similar to the antifuse OTP memory cell 500 as described above in relation to FIG. 5. A difference from the antifuse OTP memory cell 500 is that the lightly doped regions 521, 522 in the antifuse OTP memory cell 600 are electrically connected instead of separated by a channel.

An antifuse is non-conductive in the native unprogrammed state and becomes conductive when programmed. Usually, a voltage is applied on the antifuse capacitor, e.g., between the deeply doped region 523 and gate 525 or between the deeply doped region 524 and gate 525. An electric current is measured to determine if the antifuse memory cell is programmed or not. However, if the lightly doped regions 521 and 522 are not connected in the substrate 505 underneath the gate oxide 526 (i.e., separated by the channel 530 shown in FIG. 5), part of the electric current will leak into the substrate 505 through the channel 530 (FIG. 5); the current measurement will not be stable. By merging the dopant area 521 and 522, the current leakage path into the substrate 505 is blocked, and current measurement noise can be effectively reduced.

Figure 7:
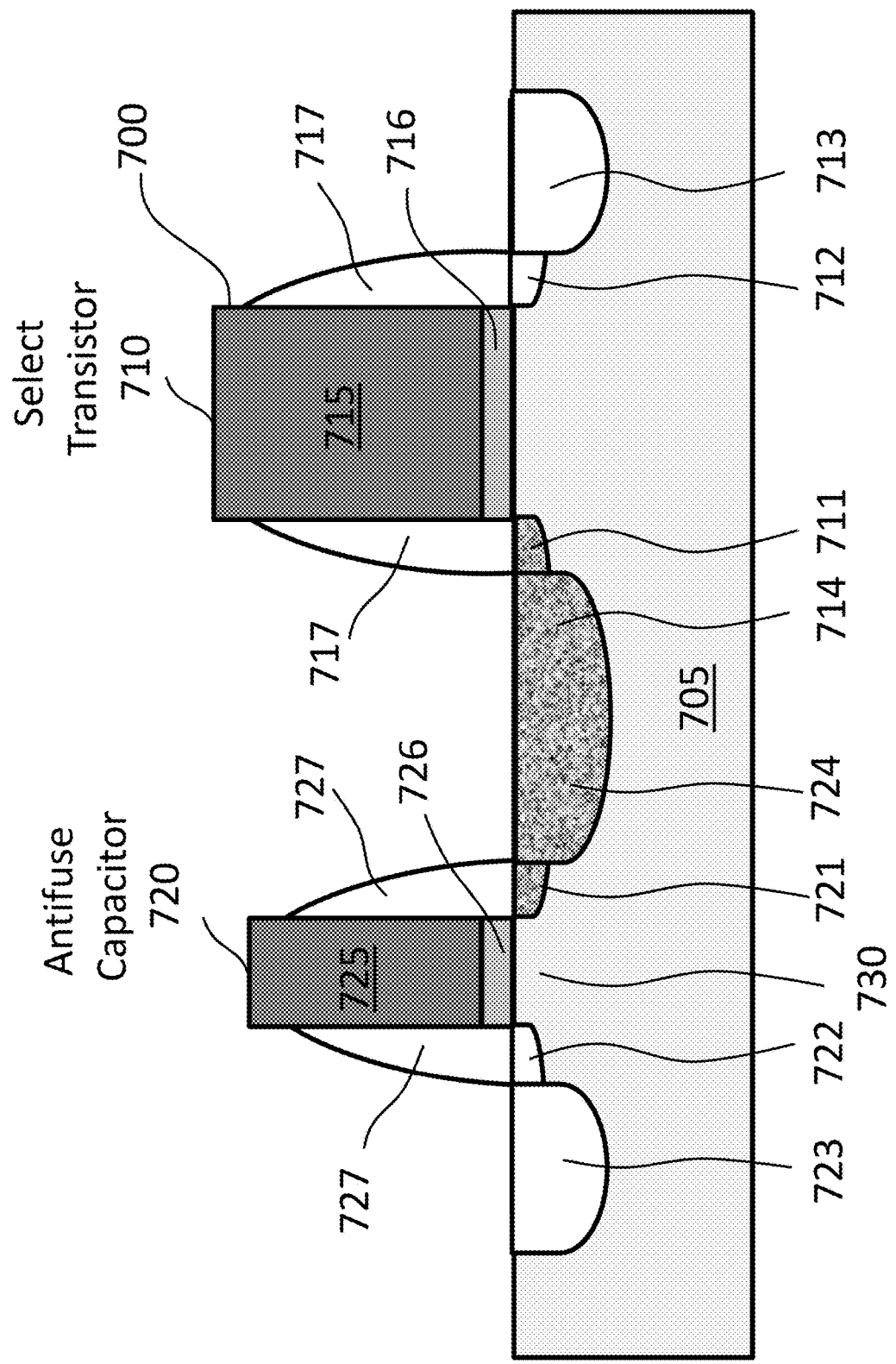
FIG. 7 is a cross-sectional view of another antifuse OTP memory cell having a hybrid low-voltage antifuse capacitor and a hybrid low-voltage select transistor in accordance with some embodiments of the present invention.

In some embodiments, referring to FIG. 7, an antifuse OTP memory cell 700 includes a select transistor 710 and an antifuse capacitor 720. The select transistor 710 includes a gate 715 on a gate dielectric 716 on a substrate 705. The gate dielectric 716 includes a thin dielectric layer, which makes the select transistor 710 a low-voltage device. For silicon oxide, a thin dielectric layer can be 40 angstroms or thinner, or further, can be thinner than 30 angstroms. The antifuse capacitor 720 includes a gate 725 on a gate dielectric 726 on the substrate 705. The gate dielectric 726 includes a thin dielectric layer, which makes the antifuse capacitor 720 also a low-voltage device.

The junctions (e.g., the source or the drain) of the select transistor 710 are formed respectively by lightly doped regions 711, 712 and the deeply doped regions 713, 714. The two junctions are separated in the substrate 705.

The junctions (e.g., source or drain) of the antifuse capacitor 720 are formed respectively by lightly doped regions 721, 722 and the deeply doped regions 723, 724. The junctions (respectively formed by the doped regions 722, 723 and the doped regions 721, 724) of the antifuse capacitor 720 are separated by a channel 730 and not connected in the substrate 705.

The combination of lightly doped regions 711, 712 and 721, 722 and deeply doped regions 713, 714 and 723, 724 is formed on both sides of the channels by applying the spacer structures 717, 727 between two doping processes.

The source/drain and the gates 715, 725 of the select transistor 710 and the antifuse capacitor 720 are of the same conductivity type. The transistor channel region, i.e., the silicon substrate 705 underneath gate dielectric is of the opposite conductivity type. In the select transistor 710, for example, if the gate 715 and source/drain respectively formed by doped regions 711, 714 and doped regions 712, 713 are N type, the regions of the substrate 705 underneath the gate dielectric 716 is P type. Thus, the source/drain regions form PN junctions with the oppositely doped silicon substrate 705. Similarly, for the antifuse capacitor 720, if the gate 725 and source/drain respectively formed by doped regions 721, 724 and 722, 723 are N type, the region of the substrate 705 underneath the gate dielectric 726 is P type.

The doped regions 711, 712 and 721, 722 are lightly doped, wherein the electrically active concentration of dopant level can be in a range of $1 \times 10^{17} \sim 1 \times 10^{19}$ atoms/cm$^3$. The doped regions 713, 714 and 723, 724 formed on both sides of the channels are deeply doped, wherein the electrically active concentration of dopant level can be above $2 \times 10^{19}$ atoms/cm$^{-3}$.

Doped regions of 713, 712 are connected, and they are electrically conductive. Similarly, doped regions 711, 714, 724, and 721 are connected, and they are electrically conductive. Doped regions 722, 723 are also connected. During antifuse programming, a voltage is applied on the gate 715 to turn on the select transistor 710, i.e., to form a conductive channel in the substrate 705 underneath the gate dielectric 716. In the meantime, a programming voltage is applied to the doped region 713. Through the conductive path underneath the gate dielectric 716, the programming voltage is actually applied on the gate dielectric 726 to cause a dielectric breakdown. A low electrical resistance will be measured between the gate 725 and the doping region 724 or the doping region 723.

In order for transistor to function normally, the junction bias needs to be below junction breakdown voltage. For low voltage transistor, a shallower and steeper junction can be used without causing breakdown. Thus, the device can have better short-channel behaviors. Formation of this kind of junction requires shallower implants, lower temperature and shorter anneals. For high-voltage transistor, it is critical to avoid a peak junction electric field that may cause breakdown; therefore, the junction profile must be adjusted accordingly. To avoid introducing a very high peak field at the junction, more gradual junction doping profiles are preferred. This usually means deeper implants, longer (maybe multiple) annealing steps. This kind of junctions consequently can handle higher bias voltages.

In the select transistor 710, the gate 715 and the gate dielectric 716 support a low-voltage device for high programming yield. The doped regions 711/714 form a high-voltage (HV) junction, while doped regions 712/713 form a low-voltage (LV) junction with the substrate 705 for the select transistor 710. The breakdown threshold voltage for HV junctions can be higher than 3.3V, or higher than 5V depending on technology node of the device. The breakdown threshold voltage for LV junctions can be lower than 3.2V, or below 2.3V depending on technology node of the device.

An important aspect of the antifuse OTP memory cell 700 is that both the gate 725 and the gate dielectric 726 in the antifuse capacitor 720 and the gate 715 and the gate dielectric 716 in the select transistor 710 support low-voltage devices, which reduce silicon footprint. Moreover, the select transistor 710 includes a low-voltage (LV) junction formed by doped regions 712/713, which also reduces silicon footprint. The other high-voltage junction formed by doped regions 711/714 enables the select transistor 710 to have an improved programming yield.

In the antifuse capacitor 720, the doped regions 721/724 form HV junctions with the substrate 705 while the doped regions 722/723 form LV junctions with the substrate 705. The breakdown threshold voltage for HV junctions can be higher than 3.3V, or higher than 5V depending on technology node of the device. The breakdown threshold voltage for LV junctions can be lower than 3.2V, or below 2.3V depending on technology node of the device. The low voltage gate dielectric layer (i.e., an LV device), a low voltage junction provides low silicon footprint, while the high voltage junction enables high programming yield.

Since HV junctions are formed for both the antifuse capacitor 720 and the select transistor 710, the deeply doped regions 714 and 724 can be combined to simplify the structure and process. Thus, the HV junction formed by doped regions 711, 714 for the select transistor 710 and the HV junction formed by doped regions 721, 724 for the antifuse capacitor 720 are conductively connected.

Figure 8:
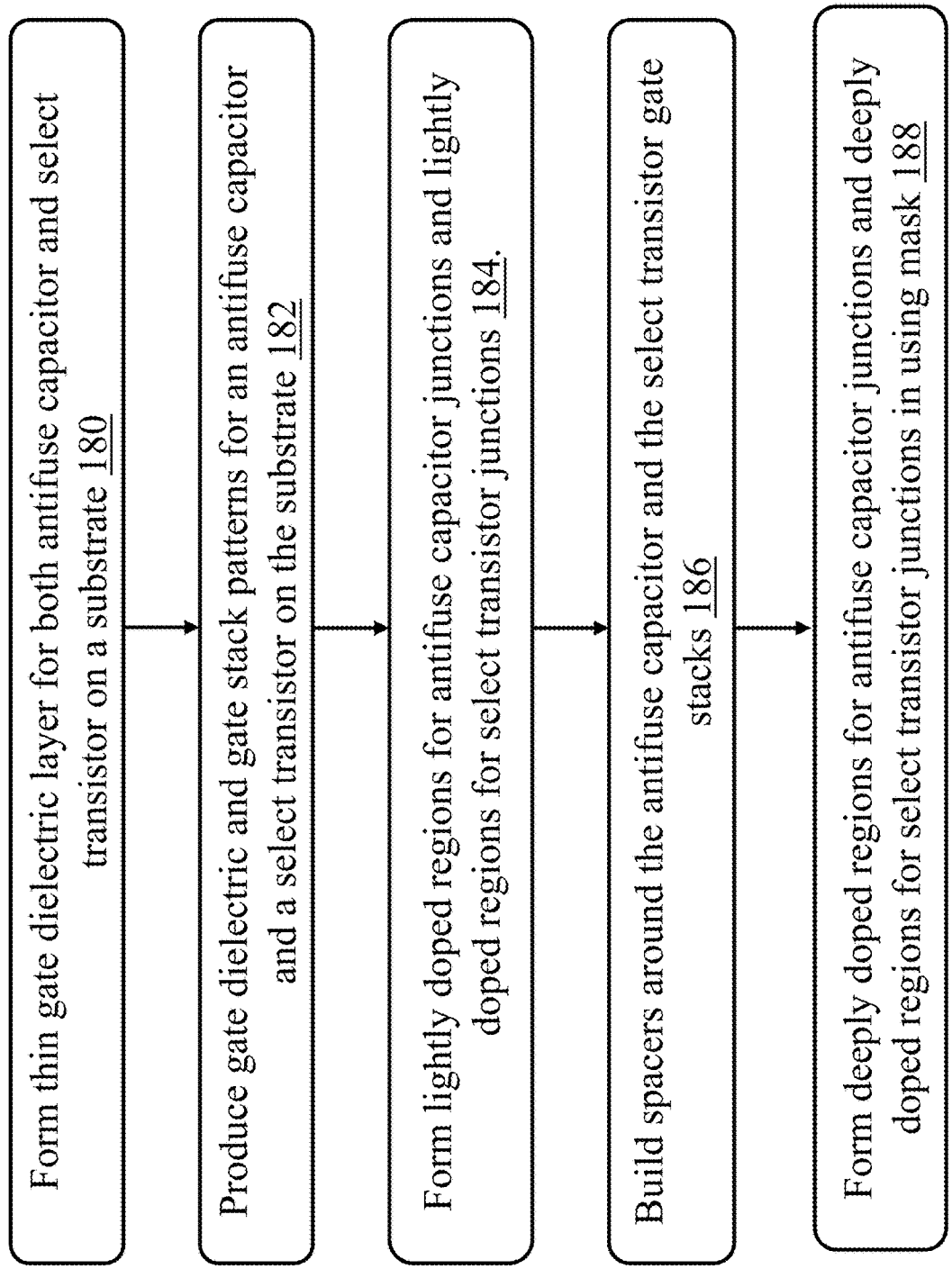
FIG. 8 is a process flow chart to build the antifuse OTP memory cell shown FIGS. 1-7.

Referring to FIG. 8, a process to build the above described antifuse OTP memory cells can include the following steps. Using the antifuse OTP memory cell 100 as an example, first, a gate dielectric layer is formed on a substrate (step 180). Gate dielectric and gate patterns are then produced for an antifuse capacitor and a select transistor on the substrate (step 182). These can be accomplished using masking and etching techniques. A thin gate dielectric layer is formed on the substrate for the antifuse capacitor, and a thicker gate dielectric layer is formed on the substrate for the select transistor respectively. Then, the gate stacks are formed on top of the gate dielectric layers. The antifuse capacitor and the select transistor are defined by masking and etching. The combination of lightly doped regions and deeply doped regions is formed by applying the spacer structures 117, 127 between two doping processes.

The relatively shallow doping regions (e.g., 121, 122 in FIGS. 1A and 1B) for the antifuse capacitor 120 and the relatively shallow doping regions (e.g., 112, 112 in FIGS. 1A and 1B) for the select transistor 110 are formed through a single masking and ion implants or separate masking and ion implants (step 184). Moreover, annealing steps maybe added after dopant implant process.

Next, spacers are built around the antifuse capacitor stack and the select transistor gate stack (step 186). Deeply doped regions 113, 114 (FIGS. 1A and 1B) for the select transistor 110, and deeply doped regions 123, 124 (FIGS. 1A and 1B) for the antifuse capacitor 120 are formed in masking process and ion implant (step 188).

The above described only serves as examples of critical process steps to build an antifuse OTP memory cell shown in FIGS. 1A-1B. Additional process steps maybe included between processes steps described above, and other process steps are needed before and after the processing steps described above for building an entire device. For example, in steps 182-188, the source and drain junctions can be formed by ion implantation.

Figure 9:
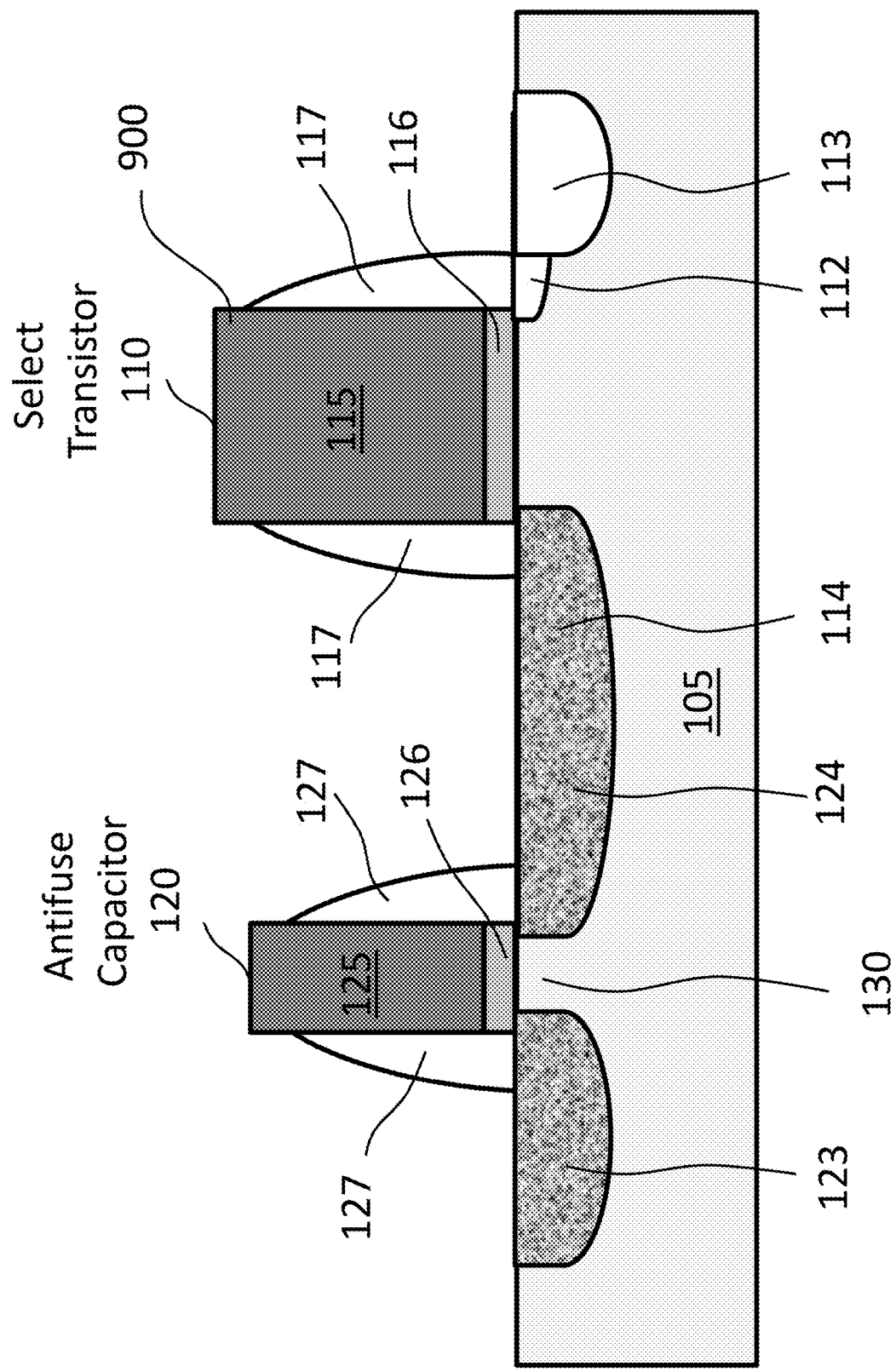
FIG. 9 is a cross-sectional view of another antifuse OTP memory cell having a hybrid low-voltage antifuse capacitor and a hybrid low-voltage select transistor related to FIGS. 1A and 1B.

In some embodiments, the high-voltage junctions of an antifuse OTP memory cell can be formed by deeply doped regions in the substrate without using the lightly doped regions. Referring to FIG. 9, an OTP memory cell 900 includes a hybrid low-voltage antifuse capacitor and a hybrid low-voltage select transistor, similar to the OTP memory cell 100 in FIGS. 1A and 1B, except that the light doped regions (111, 121, 122 in FIGS. 1A and 1B) are not formed, and anti-punch through ion implant is eliminated in these regions. The light doped region 112 is kept.

The gate dielectric 116 includes a thin dielectric layer, which makes the select transistor 110 a low-voltage device. The antifuse capacitor 120 includes a gate 125 on a gate dielectric 126 on the substrate 105. The gate dielectric 126 includes a thin dielectric layer, which makes the antifuse capacitor 120 also a low-voltage device. For silicon oxide, a thin dielectric layer is typically below 40 angstroms, and can further be thinner than 30 angstroms. A low voltage device can operate at 3.3V or below, or further at 2.5V or below.

The junctions (e.g., the source or the drain) of the select transistor 110 are formed by doped regions 112/113 (low-voltage junction) and the doped region 114 (high-voltage junction) respectively. The two junctions are separated in the substrate 105. The high-voltage junctions (e.g., source or drain) of the antifuse capacitor 120 are formed respectively by deeply doped regions 123, 124. The high-voltage junctions (respectively formed by the deeply doped region 123 and the deeply doped region 124) of the antifuse capacitor 120 are separated by a channel 130 and not connected in the substrate 105 (in contrast to the example described in FIG. 10 below). The deeply doped regions 114, 123, 124 each have a substantially uniform doping level.

Figure 10:
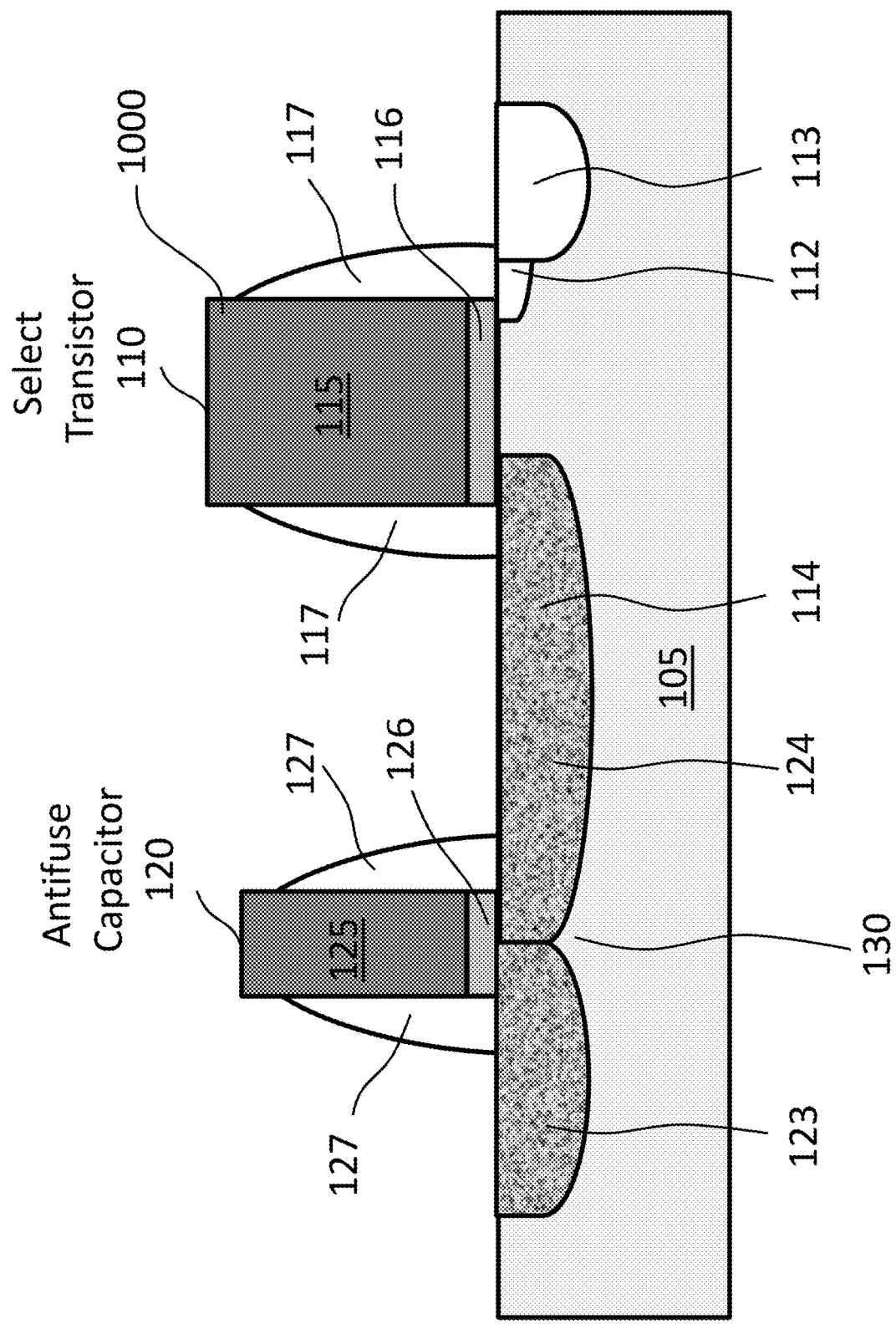
FIG. 10 is a cross-sectional view of another antifuse OTP memory cell having a hybrid low-voltage antifuse capacitor and a hybrid low-voltage select transistor related to FIG. 2.

In some embodiments, referring to FIG. 10, an OTP memory cell 1000 includes a hybrid low-voltage antifuse capacitor and a hybrid low-voltage select transistor, similar to the OTP memory cell 200 in FIG. 2, except that the light doped regions (111, 121, 122 in FIG. 2) are not formed. The light doped region 112 is kept.

The gate dielectric 116 includes a thin dielectric layer, which makes the select transistor 110 a low-voltage device. The antifuse capacitor 120 includes a gate 125 on a gate dielectric 126 on the substrate 105. The gate dielectric 126 includes a thin dielectric layer, which makes the antifuse capacitor 120 also a low-voltage device. For silicon oxide, a thin dielectric layer is typically below 40 angstroms, and can further be thinner than 30 angstroms. A low voltage device can operate at 3.3V or below, or further at 2.5V or below.

The junctions (e.g., the source or the drain) of the select transistor 110 are formed by doped regions 112/113 (low-voltage junction) and the doped region 114 (high-voltage junction) respectively. The two junctions are separated in the substrate 105. The junctions (e.g., source or drain) of the antifuse capacitor 120 are formed respectively by deeply doped regions 123, 124. The high-voltage junctions (respectively formed by the deeply doped region 123 and the deeply doped region 124) of the antifuse capacitor 120 are connected in the substrate 105 to block the current leakage path into the substrate 105, which can effectively reduce current measurement noise as described above.

The process for building the antifuse OTP memory cells 900, 1000 shown FIGS. 9-10 can include similar steps as those described above in relation to FIG. 8. The combination of lightly doped region (112) and deeply doped regions (113, 113, 123, 134) is formed by applying the spacer structures 117, 127 between two doping processes.

Figure 11:
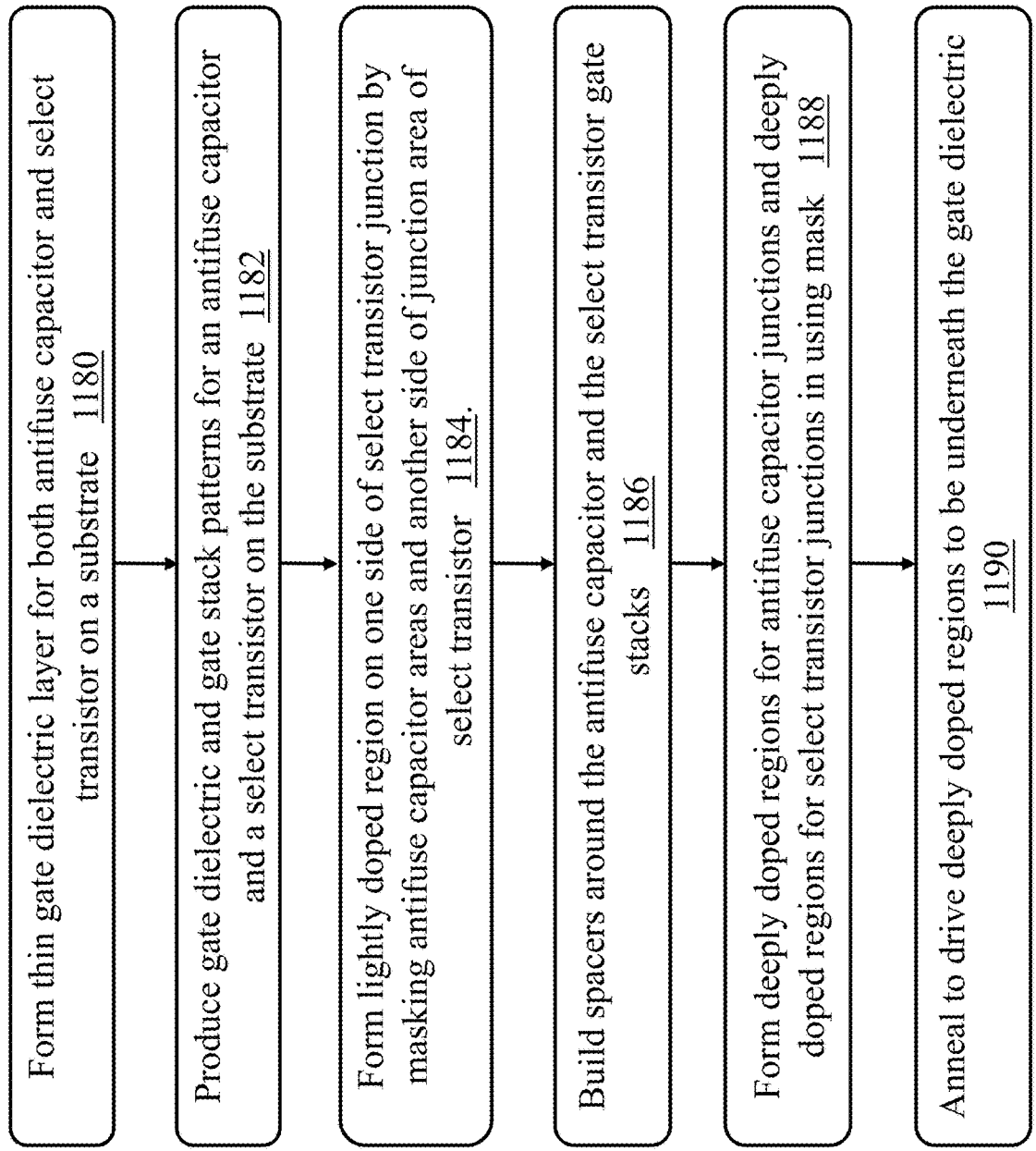
FIG. 11 is a process flow chart to build the antifuse OTP memory cell shown FIGS. 9-10.

Referring to FIG. 11, using the antifuse OTP memory cell 900/1000 as an example, first, a gate dielectric layer is formed on a substrate (step 1180). Gate dielectric and gate patterns are then produced for an antifuse capacitor and a select transistor on the substrate (step 1182). These can be accomplished using masking and etching techniques. Thin gate dielectric layers are formed on the substrate for the antifuse capacitor and for the select transistor respectively. Then, the gate stacks are formed on top of the gate dielectric layers. The antifuse capacitor and the select transistor are defined by masking and etching. The combination of lightly doped regions and deeply doped regions is formed by applying the spacer structures 117, 127 between two doping processes.

The relatively shallow doping region (112 in FIGS. 9 and 10) is formed on one side of the select transistor by masking antifuse capacitor 120 and another side of the select transistor (step 184). The anti-punch through ion implant is eliminated for antifuse capacitor and another side of the select transistor with same masking process. Moreover, annealing steps maybe added after dopant implant process.

Next, spacers are built around the antifuse capacitor stack and the select transistor gate stack (step 1186). Deeply doped regions (114 in FIGS. 9 and 10) on the other side of the select transistor 110, and deeply doped regions (123, 124 in FIGS. 9 and 10) for the antifuse capacitor 120 are formed in masking process and ion implant (step 1188). Subsequent annealing can be conducted then drives deeply doped regions to be underneath the gate dielectric. The extent of annealing can be controlled such a degree to allow the deeply doped regions 123 and 124 to electrically connect with each other (FIG. 10). The junctions are thus formed for the select transistor and the antifuse capacitor (1190).

The above description of the disclosed embodiments enables those skilled in the art to implement or use the present invention. Various modifications to these embodiments will be readily apparent to those skilled in the art, and the general principles defined herein may be applied to other embodiments without departing from the spirit or scope of the invention. Thus, the present invention will not be limited to the embodiments shown herein but will conform to the widest scope consistent with the principles and novel features disclosed herein.

What is claimed is:

1. An antifuse One-Time-Programmable memory cell, comprising:
    a substrate;
    a hybrid select transistor formed on the substrate, comprising:
        a first gate dielectric layer formed on the substrate, wherein the first gate dielectric layer is thinner than 40 nm, which enables a low-voltage select transistor device;
        a first gate formed on the gate dielectric layer;
        a low-voltage junction formed in the substrate; and
        a first high-voltage junction formed in the substrate,
    wherein a source and a drain for the select transistor are formed by the first high-voltage junction and the low-voltage junction; and
    a hybrid antifuse capacitor formed on the substrate, comprising:
        a second gate dielectric layer formed on the substrate, wherein the second gate dielectric layer is thinner than 40 nm, which enables a low-voltage antifuse capacitor device;
        a second gate formed on the gate dielectric layer;
        a second high-voltage junction formed in the substrate; and
        a third high-voltage junction formed in the substrate,
    wherein a source and a drain for the antifuse capacitor are respectively formed by the second high-voltage junction and the third high-voltage junction,
    wherein the first high-voltage junction in the hybrid select transistor and the second high-voltage junction in the antifuse capacitor are in contact with each other.

2. The antifuse One-Time-Programmable memory cell of claim 1, wherein the first high-voltage junction has a substantially uniform doping level.

3. The antifuse One-Time-Programmable memory cell of claim 1, wherein the second high-voltage junction has a substantially uniform doping level.

4. The antifuse One-Time-Programmable memory cell of claim 1, wherein the third high-voltage junction has a substantially uniform doping level.

5. The antifuse One-Time-Programmable memory cell of claim 1, wherein the second high-voltage junction and the third high-voltage junction of the antifuse capacitor are separated by a channel in the substrate.

6. The antifuse One-Time-Programmable memory cell of claim 1, wherein the second high-voltage junction and the third high-voltage junction of the antifuse capacitor are in contact with each other.

7. The antifuse One-Time-Programmable memory cell of claim 1, wherein the first gate dielectric layer is thinner than 30 nm.

8. The antifuse One-Time-Programmable memory cell of claim 1, wherein the second gate dielectric layer is thinner than 30 nm.

9. The antifuse One-Time-Programmable memory cell of claim 1, wherein the hybrid select transistor is a low voltage device operating at 3.3V or below.

10. The antifuse One-Time-Programmable memory cell of claim 1, wherein the hybrid antifuse capacitor is a low voltage device operating at 3.3V or below.

11. The antifuse One-Time-Programmable memory cell of claim 1, wherein the first high-voltage junction or the second high-voltage junction or the third high-voltage junction has a threshold junction breakdown voltage above 3.3 Volt.

12. The antifuse One-Time-Programmable memory cell of claim 11, wherein the first high-voltage junction or the second high-voltage junction or the third high-voltage junction has a threshold junction breakdown voltage above 5 Volt.

13. The antifuse One-Time-Programmable memory cell of claim 1, wherein the low-voltage junction includes a first doped region adjacent to the first gate dielectric layer at a lower doped level than a second doped region away from the first gate dielectric layer.

14. The antifuse One-Time-Programmable memory cell of claim 1, wherein the first high-voltage junction includes a first doped region adjacent to the first gate dielectric layer at a lower doped level than a second doped region away from the first gate dielectric layer.

15. The antifuse One-Time-Programmable memory cell of claim 1, wherein the second high-voltage junction or the third high-voltage junction includes a first doped region adjacent to the second gate dielectric layer at a lower doped level than a second doped region away from the second gate dielectric layer.

* * * * *